United States Patent [19]

Uchida et al.

[11] Patent Number: 4,629,679
[45] Date of Patent: Dec. 16, 1986

[54] TETRAZOLE COMPOUND-CONTAINING PHOTOPOLYMERIZABLE RESIN COMPOSITION

[75] Inventors: Hiroyuki Uchida, Ootake; Jun Nakauchi, Tokyo, both of Japan

[73] Assignee: Mitsubishi Rayon Company Ltd., Tokyo, Japan

[21] Appl. No.: 834,148

[22] Filed: Feb. 25, 1986

Related U.S. Application Data

[63] Continuation of Ser. No. 700,764, Feb. 12, 1985, abandoned.

[51] Int. Cl.$^4$ .......................... G03C 1/94; G03C 1/68
[52] U.S. Cl. .................................. 430/281; 430/954; 430/910; 430/277; 522/75; 522/95; 522/102; 522/121
[58] Field of Search ............... 430/954, 920, 921, 910, 430/277, 288, 281; 522/75, 95, 102, 121

[56] References Cited

U.S. PATENT DOCUMENTS

| | | | |
|---|---|---|---|
| 3,622,334 | 11/1971 | Hurley | 430/281 |
| 3,645,772 | 2/1972 | Jones | 430/277 |
| 3,873,316 | 3/1975 | Velten et al. | 430/274 |
| 4,438,190 | 3/1984 | Ishimaru et al. | 204/159.16 |

Primary Examiner—John E. Kittle
Assistant Examiner—Cynthia Hamilton
Attorney, Agent, or Firm—Brumbaugh, Graves, Donohue & Raymond

[57] ABSTRACT

A photopolymerizable resin composition is described which comprises, (a) 40 to 85 wt. %, based on the composition, of a thermoplastic polymer binder, (b) 15 to 60 wt. %, based on the composition, of a cross-linkable monomer having at least one ethylenically unsaturation, (c) 0.5 to 10 wt. %, based on the total of the binder (a) and the monomer (b), of a photopolymerization initiator, and (d) 0.005 to 1 wt. %, based on the total of the binder (a) and the monomer (b), of a tetrazole compound of the formula:

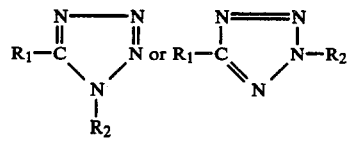

wherein $R_1$ is H, halogen, methyl, ethyl, phenyl, carboxyl, amino, dimethylamino, diethylamino, methoxy, ethoxy, mercapto or sulfonic acid; and $R_2$ is H, methyl, ethyl, phenyl, amino or mercapto. The photopolymerization resin composition exhibits an enhanced adhesion to a metal surface, and is useful as a photoresist for fabrication of a printed circuit board.

9 Claims, No Drawings

TETRAZOLE COMPOUND-CONTAINING PHOTOPOLYMERIZABLE RESIN COMPOSITION

This application is a continuation of application Ser. No. 700,764, filed on Feb. 12, 1985, now abandoned.

BACKGROUND OF THE INVENTION (1) Field of the Invention

The present invention relates to a photopolymerizable resin composition having an improved adhesion to a metal surface, especially one suitable for use as a photoresist for fabrication of a printed circuit board.

(2) Description of the Related Art

Ordinarily, fabrication of a printed circuit board by using a photoresist is carried out by the steps of (1) laminating a photoresist on a substrate such as a copper clad epoxy-glass board, (2) irradiating the substrate with active rays through a pattern mask film to form an image, (3) selectively dissolving and removing the uncured portion of the photoresist by using an appropriate developing solvent to expose the copper surface and form a resist pattern, (4) electrolytically plating copper on the exposed copper surface and then electrolytically plating solder, (5) removing the cured resist by using an appropriate solvent to expose the copper surface, and (6) etching the exposed copper surface with an appropriate solvent by using the solder-plated layer as the resist to obtain a printed circuit board in which the solder-coated portion forms a wiring portion.

The important requisite for the photoresist in the above-mentioned fabrication process is that the photoresist is not corroded by a plating solution or the like and the substrate covered with the photoresist is sufficiently protected. Especially, peeling of the cured resist caused at the high-throw solder plating results in intrusion of the plating solution between the cured resist and the copper surface. Consequently the solder is plated on the portion other than the circuit portion and such troubles as short-circuits of conductor lines, broadening of the thickness of conductor lines, and disfigurement of the peripheral edges of conductor lines are caused.

These troubles are due to an insufficient adhesion of the cured resist to the copper surface. Therefore, researches have been made for developing adhesion promoting agents. For example, U.S. Pat. No. 3,622,334 proposes addition of a heterocyclic nitrogen-containing compound such as benzotriazole or benzimidazole to a photopolymerizable resin composition.

However, in the production of a printed circuit board comprising wiring lines having a narrow thickness sufficient to meet recent requirements of high density and high precision, a high-precision pattern cannot be obtained unless the amount of the abovementioned heterocyclic nitrogen-containing compound added is increased. This results in occurrence of other troubles. More specifically, an increase of the amount of benzotriazole or benzimidazole added causes discoloration or fading of a dye used for confirmation of the pattern configuration or reduction of the sensitivity of the photoresist. If the amount of the photopolymerization initiator added is increased for increasing the sensitivity, the section of the resolved pattern comes to have an inverse trapezoidal shape and the resolving power is reduced. Moreover, if the amount of an additive having a low molecular weight is increased, dissolution of the cured resist layer is caused at various steps and the resistance of the resist film is reduced.

SUMMARY OF THE INVENTION

It is the primary object of the present invention to provide a photopolymerizable resin composition exhibiting an enhanced adhesion to a metal surface.

In accordance with the present invention, there is provided a photopolymerizable resin composition comprising (a) 40% to 85% by weight, based on the total weight of the photopolymerizable resin composition, of a thermoplastic polymer as a binder, (b) 15% to 60% by weight, based on the total weight of the photopolymerizable resin composition, of a cross-linkable monomer having at least one ethylenically unsaturated group in the molecule, (c) 0.5% to 10% by weight, based on the total weight of the thermoplastic polymer (a) and the cross-linkable monomer (b), of a photopolymerization initiator, and (d) 0.005% to 1% by weight, based on the total weight of the thermoplastic polymer (a) and the cross-linkable monomer (b), of a tetrazole compound represented by the formula:

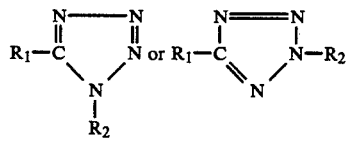

wherein $R_1$ is hydrogen, a halogen, or a methyl, ethyl, phenyl, carboxyl, amino, dimethylamino, diethylamino, methoxy, ethoxy, mercapto or sulfonic acid group; and $R_2$ is hydrogen or a methyl, ethyl, phenyl, amino or mercapto group.

DESCRIPTION OF THE PREFERRED EMBODIMENTS

The photopolymerizable resin composition of the present invention is characterized in that since tetrazole or a derivative thereof is contained, the adhesion of the photoresist to a copper plate is highly improved and troubles such as peeling of the resist layer or intrusion of the plated metal are not caused. Accordingly, the photopolymerizable resin composition of the present invention is suitable for fabrication of a printed circuit board having a fine pattern.

Any thermoplastic polymer that can be dissolved in or swollen by a developing solvent can be used as the binder polymer in the present invention. For example, in case of a photoresist for which 1,1,1-trichloroethane is used as the developing solvent, poly(methyl methacrylate) or a copolymer composed mainly of methyl methacrylate is used as the binder. As the monomer to be copolymerized with methyl methacrylate, there can be mentioned esters of methacrylic acid and acrylic acid, such as methyl acrylate, ethyl acrylate, ethyl methacrylate, n-propyl acrylate, n-propyl methacrylate, isopropyl acrylate, isopropyl methacrylate, n-butyl acrylate, n-butyl methacrylate, isobutyl acrylate, isobutyl methacrylate, t-butyl acrylate, t-butyl methacrylate, 2-ethylhexyl acrylate, 2-ethylhexyl methacrylate, lauryl acrylate, lauryl methacrylate, 2-hydroxyethyl acrylate, 2-hydroethyl methacrylate, 2-hydroxypropyl acrylate, 2-hydroxypropyl methacrylate, and styrene.

In case of a photoresist for which a dilute solution of an alkali such as sodium carbonate is used as the developing solvent, a copolymer of an acrylic or methacrylic acid ester as described above or styrene with a carboxylic acid such as acrylic acid, methacrylic acid, itaconic acid, fumaric acid or maleic acid can be used as the binder resin.

A preferable molecular weight and copolymer composition of the thermoplastic resin as the binder vary according to the intended use. However, it is generally preferred that the number average molecular weight (Mn) of the thermoplastic polymer as the binder be in the range of from 20,000 to 200,000. The amount of the thermoplastic polymer is in the range of from 40% to 85% by weight based on the weight of the photopolymerizable resin composition.

As the cross-linkable monomer having at least one ethylenically unsaturated group in the molecule, that is another indispensable component of the composition of the present invention, there can be mentioned polyester acrylates such as polyethylene glycol diacrylate, pentaerythritol diacrylate, pentaerythritol triacrylate, pentaerythritol tetraacrylate and trimethylolpropane triacrylate; polyester methacrylates such as polyethylene glycol dimethacrylates, pentaerythritol dimethacrylate, pentaerythritol trimethacrylate, pentaerythritol tetraacrylate and trimethylolpropane trimethacrylate; epoxy acrylates; epoxy methacrylates; urethane acrylates; and urethane methacrylates. These compounds may be used along or in the form of mixtures of two or more. The cross-linkable monomer is incorporated in the composition in an amount of 15% to 60% by weight. If the amount of the cross-linkable monomer is smaller than 15% by weight, the film is not sufficiently cured. If the amount of the cross-linkable monomer exceeds 60% by weight, the photoresist becomes too soft and cold flow is readily caused.

As the photopolymerization initiator used in the composition of the present invention, known photopolymerization initiators may be used. For example, there can be mentioned benzophenone, Michler's ketone, 4,4'-bis(-diethylamino)benzophenone, t-butylanthraquinone, 2-ethylanthraquinone, thioxanthones, benzoin alkyl ethers and benzyl ketals. These initiators may be used alone or in the form of mixtures of two or more. In view of the cost, the finished pattern or the resolution, the amount of the photopolymerization initiator used in the composition is adjusted to 0.5% to 10% by weight, based on the total weight of the thermoplastic polymer binder and the cross-linkable monomer.

The tetrazole or its derivative used in the present invention is a component which is very effective for improving the adhesion of the photoresist to a metal plate. As especially preferred examples, there can be mentioned 1-phenyltetrazole, 5-phenyltetrazole, 5-aminotetrazole, 5-amino-1-methyltetrazole, 5-amino-2-phenyltetrazole, 5-mercapto-1-phenyltetrazole, 5-mercapto-1-methyltetrazole, 5-bromotetrazole, 5-hydroxytetrazole, 5-methoxytetrazole, 5-dimethylaminotetrazole, 5-tetrazolecarboxylic acid and 5-tetrazolesulfonic acid. The amount of the tetrazole compound in the composition may be varied according to the kinds and amounts of the components of the photoresist and the hardness of the photoresist after curing. However, in order to obtain an effective adhesion, it is preferred that the tetrazole compound be incorporated in the composition in an amount of 0.005% to 1% by weight, more preferably 0.025% to 0.5% by weight, based on the total weight of the thermoplastic polymer binder and the cross-linkable monomer. If the amount of the tetrazole compound is too large, the sensitivity is reduced. If the amount of the tetrazole compound is too small, intrusion of the plated metal is readily caused at the solder-plating step.

The composition of the present invention can be used in the absence of a diluent, but better results are ordinarily obtained when a solvent being capable of dissolving the base resin therein and having a melting point which is not so high, such as methyl ethyl ketone, methylene chloride, a methylene chloride/methyl alcohol mixture or isopropyl alcohol is used as a diluent. The solvent is used in an amount of up to 200% by weight, preferably 100% to 200% by weight, based on the resin composition.

A plasticizer, an inhibitor, a filler and the like may be incorporated in the composition of the present invention if desired.

The photopolymerizable resin composition of the present invention is useful as a photoresist for fabrication of a printed circuit board. The fabrication of a printed circuit board is prepared as follows.

A photoresist layer of the photopolymerizable resin composition of the present invention is formed on the surface of a metal such as copper, nickel or chromium, preferably copper. As for forming the photoresist layer, there can be mentioned a method in which the composition is coated as a liquid resist on the metal surface and dried, and then, a protecting film is covered on the photoresist layer. As the protecting film for the liquid resist, there is preferably used a film of an inactive polyolefin such as polyethylene or polypropylene. Another method can be mentioned in which a dry film photoresist of the composition is laminated on the metal surface. The thickness of the photoresist layer is varied according to the intended use, but, ordinarily, the thickness of the photoresist layer is adjusted to about 5 to about 100 $\mu$m in the dry state. The dry film photoresist is prepared, for example, by coating the photopolymerizable resin composition on a support film of a polyester, drying the composition and then laminating a protecting film of a polyolefin thereon.

Then, the photoresist is irradiated with active rays through a negative or positive mask pattern film called "artwork". As the active ray source, there can be effectively used sources for effectively emitting ultraviolet rays, such as a carbon arc lamp, a superhigh-pressure mercury lamp, a high-pressure mercury lamp and a xenon lamp. The exposed dose is not particularly limited, but it is ordinarily preferred that the exposure dose be up to 300 mJ/cm$^2$, more preferably 50 to 200 mJ/cm$^2$. After exposure to active rays, the unexposed portion is washed away and removed by using an appropriate developing solvent, whereby a resist pattern of the cured portion is formed.

The developing solvent should be safe and stable. However, it is important that the developing solvent be selected while taking the adaptability to the developing operation into consideration. Namely, the developing solvent should be selected so that the difference of the rate of dissolution between the cured and uncured portions of the photoresist is very large and the rate of dissolution of the uncured portion is appropriately high. In case of a photoresist of the ordinary solvent-developing type, 1,1,1-trichloroethane is preferably used. In case of a photoresist of the aqueous developing type, a dilute solution of sodium carbonate or the like is preferably used.

As the development method, there can be mentioned a dip method, a paddle method and a spray method. A high-pressure spray method is especially preferred for improving the resolution.

For the electrolytic copper plating to be conducted after the development, there are used a plating solution of copper sulfate and a plating solution of copper pyrophosphate. For the solder deposition, high-throw solder plating is often carried out.

The photopolymerizable resin composition of the present invention has a very excellent resist capacity for wiring on a metal-clad board, especially wiring on a copper clad board used for fabrication of a printed circuit board. Accordingly the photopolymerizable resin composition of the present invention is suitable for wiring for which high precision and high density are required.

The present invention will now be described in detail with reference to the following examples. In the examples, all of "parts" are by weight.

EXAMPLES 1 through 6 and COMPARATIVE EXAMPLE 1

A photosensitive resin composition comprising 100 parts of poly(methyl methacrylate) having a molecular weight (Mn) of 60,000, 50 parts of trimethylolpropane triacrylate, 10 parts of polyethylene glycol diacrylate, 1 part of benzyldimethylketal, 0.05 part of hydroquinone, 0.1 part of Malachite Green, 150 parts of methyl ethyl ketone and a variable amount of 5-aminotetrazole was coated on a copper clad epoxy glass board by a doctor knife. The coated composition was dried to evaporate methyl ethyl ketone and form a photoresist having a thickness of 50 $\mu$m. A polyethylene film having a thickness of 25 $\mu$m was laminated as a protecting film on the photoresist layer, and an artwork was placed closely onto the protecting film. The assembly was exposed to rays from a super-high-pressure mercury lamp. A line-and-space pattern of 50 $\mu$m, 60 $\mu$m, 80 $\mu$m and 100 $\mu$m was used as the art work. A super-high-pressure mercury lamp, Model USH-102D supplied by Ushio Denki K.K., was used as the mercury lamp, and the exposed dose was 80 mJ/cm$^2$. The light exposure intensity was measured by an ultraviolet intensity meter (Model UIT-102D supplied by Ushio Denki K.K.) and a light detector (Model UVD-365P supplied by Ushio Denki K.K.) attached to the ultraviolet intensity meter. The light exposure intensity was set at 2 mW/cm$^2$.

After the light exposure, the assembly was allowed to stand still for 20 minutes and the protecting film was peeled. Development was carried out in a Du Pont "C" processor (supplied by Du Pont Co.) charged with 1,1,1-trichloroethane. The temperature was maintained at 18 to 20° C., the travelling speed was 200 cm/min, and the spray pressure was adjusted to 1.4 kg/cm$^2$.

The plate which had been subjected to the development treatment was immersed in an aqueous solution of a neutral detergent at room temperature for about 1 minute. After degreasing, spray water washing was carried out for about 1 minute in an overflow tank and then the plate was immersed in an aqueous solution of ammonium persulfate having a concentration of about 20% by weight for 1 minute. Subsequently, spray water washing was conducted again for about 1 minute, and the plate was immersed in a bath of an aqueous solution of sulfuric acid having a concentration of about 15% by weight. Then spray water washing was conducted again for 1 minute.

The plate was placed in a copper pyrophosphate plating tank (pH value=8.2 to 8.4, temperature=50°±2° C.) and plating was carried out at a current density of 2.7 A/cm$^2$ for 45 minutes.

After the plating operation, water washing was immediately carried out and the plate was immersed in a 15% aqueous solution of fluoroboric acid. Solder plating was carried out at room temperature at a current density of 1.5 A/dm$^2$ in a high-throw solder plating solution comprising 15 g/l of tin, 10 g/l of lead, 400 g/l of free fluoroboric acid, 21.6 g/l of free boric acid and 5.2 g/l of peptone. After the solder plating operation, the plate was washed with water and dried. In order to check the undesirable intrusion development in the plated product, the sample was cut out and the section of the resist was observed by an optical microscope. The obtained results are shown in Table 1.

EXAMPLES 7 and 8

The procedures of Example 1 were repeated in the same manner except that 5-phenyltetrazole was used as the additive instead of 5-aminotetrazole used in Example 1. The results of evaluation of the plated product are shown in Table 1.

COMPARATIVE EXAMPLES 2 through 5

The procedures of Example 1 were repeated in the same manner except that benzotriazole was used as the additive in an amount shown in Table 1 instead of 5-aminotetrazole used in Example 1 and the exposed dose was varied as shown in Table 1. The results of evaluation of the plated product are shown in Table 1.

TABLE 1

| | Additive (parts) | Exposed dose necessary for patterning (mJ/cm$^2$) | State of resist after plating | | | | Discrimination of pattern by dye |
|---|---|---|---|---|---|---|---|
| | | | 50 $\mu$m | 60 $\mu$m | 80 $\mu$m | 100 $\mu$m | |
| Comparative Example 1 | 5-Aminotetrazole (0) | 80 | Resist peeled | Resist peeled | Resist peeled | Resist peeled | Good |
| Example 1 | 5-Aminotetrazole (0.01) | 80 | Good | Good | Good | Good | Good |
| Example 2 | 5-Aminotetrazole (0.05) | 80 | Good | Good | Good | Good | Good |
| Example 3 | 5-Aminotetrazole (0.1) | 80 | Good | Good | Good | Good | Good |
| Example 4 | 5-Aminotetrazole (0.5) | 80 | Good | Good | Good | Good | Good |
| Example 5 | 5-Aminotetrazole (1.0) | 80 | Good | Good | Good | Good | Good |
| Example 6 | 5-Aminotetrazole (5.0) | 80 | Development impossible by insufficient exposure | Development impossible by insufficient exposure | Development impossible by insufficient exposure | Good | Difficult because of color fading |
| Example 7 | 5-Phenyltetrazole (0.01) | 80 | Good | Good | Good | Good | Good |
| Example 8 | 1-Phenyltetrazole (0.01) | 80 | Good | Good | Good | Good | Good |
| Comparative | Benzotriazole (0.01) | 80 | Resist | Resist | Intru- | Intru- | Good |

TABLE 1-continued

| | Additive (parts) | Exposed dose necessary for patterning (mJ/cm$^2$) | State of resist after plating | | | | Discrimination of pattern by dye |
|---|---|---|---|---|---|---|---|
| | | | 50 μm | 60 μm | 80 μm | 100 μm | |
| Example 2 | | | peeled | peeled | sion* plating | sion* plating | |
| Comparative Example 3 | Benzotriazole (0.1) | 80 | Resist peeled | Intrusion plating | Good | Good | Good |
| Comparative Example 4 | Benzotriazole (1.0) | 80 | Development impossible by insufficient exposure | Development impossible by insufficient exposure | Good | Good | Good |
| Comparative Example 5 | Benzotriazole (5.0) | 80 | Development impossible by insufficient exposure | Development impossible by insufficient exposure | Development impossible by insufficient exposure | Development impossible by insufficient exposure | Difficult because of color fading |
| Comparative Example 6 | Benzotriazole (0.1) | 100 | Resist peeled | Resist peeled | Intrusion* plating | Good | Good |
| Comparative Example 7 | Benzotriazole (1.0) | 180 | Resist peeled | Intrusion plating | Good | Good | Good |
| Comparative Example 8 | Benzotriazole (5.0) | 270 | Development impossible by insufficient exposure | Development impossible by insufficient exposure | Good | Good | Difficult because of color fading |

*Undesirable intrusion of a plating solution between the cured photoresist and the copper surface observed.

EXAMPLES 9 through 14 and COMPARATIVE EXAMPLE 9

A copper clad epoxy-glass board was coated with a photosensitive resin composition comprising 100 parts of a methyl methacrylate/methyl acrylate/methacrylic acid copolymer (50/25/25 by weight) having a molecular weight (Mn) of 70,000, 50 parts of trimethylolpropane triacrylate, 10 parts of polyethylene glycol diacrylate, 1 part of benzyldimethylketal, 0.05 part of hydroquinone, 0.1 part of Methylene Blue, 200 parts of methylene chloride/methyl alcohol (90/10), and a variable amount of 5-aminotetrazole by means of a doctor knife. The coated composition was dried to evaporate the solvent and form a photoresist having a thickness of 50 μm. A polyethylene film having a thickness of 25 μm was laminated as a protecting film on the photoresist layer, and an artwork was placed closely onto the protecting film. The assembly was exposed to rays from a superhigh-pressure mercury lamp in the same manner as that described in Examples 1 through 6.

After the light exposure, the assembly was allowed to stand still for 20 minutes. The protecting film was peeled and development was carried out by using an alkali developing machine of the spray type charged with a 1.0% aqueous solution of sodium carbonate. The temperature was maintained at 30° C., the development time was 60 seconds, and the spray pressure was adjusted to 1.4 kg/cm$^2$.

The plate which had been subjected to the development treatment was immersed in an aqueous solution of a neutral detergent at room temperature for about 1 minute. After degreasing, spray water washing was conducted for about 1 minute in an overflow tank. Then, the plate was immersed in an aqueous solution of ammonium persulfate having a concentration of about 20% by weight for 1 minute. Subsequently, spray water washing was conducted for about 1 minute again and the plate was immersed in a bath of an aqueous solution of sulfuric acid having a concentration of about 15% by weight. Then, spray water washing was conducted for 1 minute again. Plating was then carried out for 83 minutes at a current density of 2.2 A/dm$^2$ in a copper sulfate plating tank (maintained at 22° C.).

After the plating operation, the plate was immediately washed with water and immersed in a 15% aqueous solution of fluoroboric acid. Solder plating was carried out at room temperature at a current density of 1.5 A/dm$^2$ in a high-throw solder plating solution comprising 15 g/l of tin, 10 g/l of lead, 400 g/l of free fluoroboric acid, 21.6 g/l of free boric acid, and 5.2 g/l of peptone. After the plating operation, the plated product was washed with water and dried. In order to check the undesirable intrusion development in the plated product, the sample was cut out and the section of the resist was observed by an optical microscope. The obtained results are shown in Table 2.

TABLE 2

| | Additive (parts) | Exposed dose necessary for patterning (mJ/cm$^2$) | State of resist after plating | | | | Discrimination of pattern by dye |
|---|---|---|---|---|---|---|---|
| | | | 50 μm | 60 μm | 80 μm | 100 μm | |
| Comparative Example 9 | 5-Aminotetrazole (0) | 80 | Resist peeled | Resist peeled | Resist peeled | Resist peeled | Good |
| Example 9 | 5-Aminotetrazole (0.01) | 80 | Good | Good | Good | Good | Good |

TABLE 2-continued

| | Additive (parts) | Exposed dose necessary for patterning (mJ/cm²) | State of resist after plating | | | | Discrimination of pattern by dye |
| --- | --- | --- | --- | --- | --- | --- | --- |
| | | | 50 μm | 60 μm | 80 μm | 100 μm | |
| Example 10 | 5-Aminotetrazole (0.05) | 80 | Good | Good | Good | Good | Good |
| Example 11 | 5-Aminotetrazole (0.1) | 80 | Good | Good | Good | Good | Good |
| Example 12 | 5-Aminotetrazole (0.5) | 80 | Good | Good | Good | Good | Good |
| Example 13 | 5-Aminotetrazole (1.0) | 80 | Good | Good | Good | Good | Good |
| Example 14 | 5-Aminotetrazole (5.0) | 80 | Development impossible by insufficient exposure | Development impossible by insufficient exposure | Development impossible by insufficient exposure | Good | Difficult because of color fading |

We claim:

1. A photopolymerizable resin composition comprising (a) 40% to 85% by weight, based on the total weight of the photopolymerizable resin composition, of a thermoplastic polymer as a binder, (b) 25% to 50% by weight, based on the total weight of the photopolymerizable resin composition, of a cross-linkable monomer having at least one ethylenically unsaturated group in the molecule, (c) 0.5% to 10% by weight, based on the total weight of the thermoplastic polymer (a) and the cross-linkable monomer (b), of a photopolymerization initiator, and (d) 0.005% to 1% by weight, based on the total weight of the thermoplastic polymer (a) and the cross-linkable monomer (b), of a tetrazole compound represented by the formula:

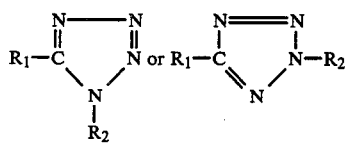

wherein $R_1$ is hydrogen, a halogen, or a methyl, ethyl, phenyl, carboxyl, amino, dimethylamino, diethylamino, methoxy, ethoxy, or sulfonic acid group; and $R_2$ is hydrogen or a methyl, ethyl, phenyl, or amino group.

2. A photopolymerizable resin composition according to claim 1, wherein said thermoplastic polymer has a number average molecular weight of 20,000 to 200,000.

3. A photopolymerizable resin composition according to claim 1, wherein said thermoplastic polymer is selected from the group consisting of polymethyl methacrylate; a copolymer comprised of methyl methacrylate and an acrylic or methacrylic acid ester (other than methyl methacrylate) or styrene; and a copolymer comprised of an acrylic or methacrylic acid ester or styrene, and a carboxylic acid.

4. A photopolymerizable resin composition according to claim 1, wherein said cross-linkable monomer is selected from the group consisting of polyester acrylates, polyester methacrylates, epoxy acrylates, epoxy methacrylates, urethan acrylates, and urethane methacrylates.

5. A photopolymerizable resin composition according to claim 1, wherein said photopolymerizable initiator is selected from the group consisting of benzophenone, Michler's ketone, 4,4-bis(diethylamino)-benzophenone, t-butylanthraquinone, 2-ethylanthraquinone, thioxanthones, benzoin alkyl ethers and benzyl ketals.

6. A photopolymerizable resin composition according to claim 1, wherein said tetrazole compound is selected from the group consisting of 1-phenyltetrazole, 5-phenyltetrazole, 5-aminotetrazole, 5-amino-1-methyltetrazole, 5-amino-2-phenyltetrazole, 5-bromotetrazole, 5-hydroxytetrazole, 5-methoxytetrazole, 5-dimethylaminotetrazole, 5-tetrazolecarboxylic acid and 5-tetrazolesulfonic acid.

7. A photopolymerizable resin composition according to claim 1, wherein the amount of said tetrazole compound is 0.025% to 0.5% by weight.

8. A photopolymerizable resin composition according to claim 1, wherein the tetrazole compound is 5-aminotetrazole.

9. A photopolymerizable resin composition according to claim 1, wherein the tetrazole compound is 5-phenyltetrazole.

* * * * *